(12) United States Patent
Okamoto et al.

(10) Patent No.: US 9,244,365 B2
(45) Date of Patent: Jan. 26, 2016

(54) METHOD FOR MEASURING PATTERN MISALIGNMENT

(71) Applicant: Kabushiki Kaisha Toshiba, Minato-ku (JP)

(72) Inventors: Yosuke Okamoto, Tokyo (JP); Yoshinori Hagio, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 360 days.

(21) Appl. No.: 13/952,943

(22) Filed: Jul. 29, 2013

(65) Prior Publication Data

US 2014/0285652 A1 Sep. 25, 2014

(30) Foreign Application Priority Data

Mar. 22, 2013 (JP) .................................. 2013-061122

(51) Int. Cl.
*H04N 7/18* (2006.01)
*G03F 7/20* (2006.01)
*G06T 7/00* (2006.01)

(52) U.S. Cl.
CPC .......... *G03F 7/70633* (2013.01); *G06T 7/0004* (2013.01); *G06T 2207/10061* (2013.01); *G06T 2207/30148* (2013.01)

(58) Field of Classification Search
CPC .................. G03F 9/70; G03F 7/70633; G06T 2207/10061; G06T 2207/30148; G06T 7/0004; G06T 7/001; G06K 9/6203
USPC ..................................... 348/80; 382/145, 147
See application file for complete search history.

(56) References Cited

U.S. PATENT DOCUMENTS

| | | | | |
|---|---|---|---|---|
| 5,989,761 A * | 11/1999 | Kawakubo | .......... | G03F 7/70358 430/22 |
| 6,841,890 B2 * | 1/2005 | Fujimoto | .............. | G03F 9/7076 257/797 |
| 2002/0144221 A1* | 10/2002 | Noda | .................... | G06T 7/0004 716/112 |
| 2003/0174879 A1* | 9/2003 | Chen | ................... | G03F 7/70633 382/151 |
| 2009/0202139 A1* | 8/2009 | Toyoda | ................ | G06K 9/6255 382/145 |
| 2011/0155904 A1* | 6/2011 | Hotta | .................. | G03F 7/70466 250/307 |

FOREIGN PATENT DOCUMENTS

| | | |
|---|---|---|
| JP | 2001-133955 | 5/2001 |
| JP | 2003-224061 | 8/2003 |

(Continued)

OTHER PUBLICATIONS

Office Action issued May 21, 2015 in Japanese Patent Application No. 2013-061122 (with English language translation).

*Primary Examiner* — Sath V Perungavoor
*Assistant Examiner* — Nathnael Aynalem
(74) *Attorney, Agent, or Firm* — Oblon, McClelland, Maier & Neustadt, L.L.P.

(57) ABSTRACT

According to one embodiment, a method for measuring pattern misalignment, includes: a first step obtaining image data; a second step specifying a measurement region; a third step calculating a first shift amount (x1, y1); a fourth step determining, after calculating the first shift amount, a first distribution; a fifth step executing a plurality of times the second step, the third step, and the fourth step; a seventh step calculating a second shift amount (x2, y2); an eighth step determining, after calculating the second shift amount, a second distribution; a ninth step executing a plurality of times the sixth step, the seventh step, and the eighth step; and a tenth step calculating a difference (x2−x1, y2−y1) between the second pattern misalignment and the first pattern misalignment.

16 Claims, 5 Drawing Sheets

BEFORE POSITIONING    AFTER POSITIONING

(56) References Cited

FOREIGN PATENT DOCUMENTS

| | | | |
|---|---|---|---|
| JP | 2004-259909 | | 9/2004 |
| JP | 2009-194051 A | | 8/2009 |
| JP | 2009-216503 A | | 9/2009 |
| JP | 2009216503 | * | 9/2009 |
| JP | 2010-177500 A | | 8/2010 |

* cited by examiner

METHOD FOR MEASURING PATTERN MISALIGNMENT

CROSS-REFERENCE TO RELATED APPLICATIONS

This application is based upon and claims the benefit of priority from Japanese Patent Application No. 2013-061122, filed on Mar. 22, 2013; the entire contents of which are incorporated herein by reference.

FIELD

Embodiments described herein relate generally to a method for measuring pattern misalignment.

BACKGROUND

The process for manufacturing a semiconductor device includes e.g. the step of forming an electrode electrically connected to a semiconductor layer through an opening of an insulating film, or the step of forming a conductive via electrically connected to a wiring of each wiring layer of a multilayer wiring structure through an opening of an insulating film. These steps require forming an upper layer pattern in alignment with a lower layer pattern. If the upper layer pattern is formed out of alignment with the lower layer pattern, problems such as wiring failure and increased wiring resistance occur. Thus, after completing the formation of the upper layer pattern, an inspection step for measuring misalignment of the upper layer pattern with respect to the lower layer pattern is required. Marks dedicated to misalignment detection are previously placed on a scribe line for separating semiconductor chips in each of the lower layer and the upper layer. In the step of inspecting misalignment, the misalignment between the mark provided on the lower layer and the mark provided on the upper layer is measured by an optical measurement apparatus. This optical measurement method has short measurement through put and can easily view the mark of the lower layer through the film of the upper layer. Thus, misalignment can be frequently measured in an arbitrary step. However, the problem is that the pattern for measuring alignment needs to be formed larger than the pattern of the semiconductor device. Another problem is that the main pattern in the semiconductor device is not directly measured. In this context, in order to measure misalignment, use of a scanning electron microscope (SEM) secondary electron image (hereinafter referred to as SEM image) is under investigation. The SEM-based measurement method has the advantage of having higher spatial resolution than the optical measurement method, and being able to directly measure the misalignment of the main pattern of the semiconductor device. However, the SEM image is based on the information of a local region. Thus, due to the unevenness of the pattern and the overlapping condition of the upper layer pattern on the lower layer pattern, the accuracy of measuring pattern misalignment is likely to decrease.

DETAILED DESCRIPTION

Figure 1:
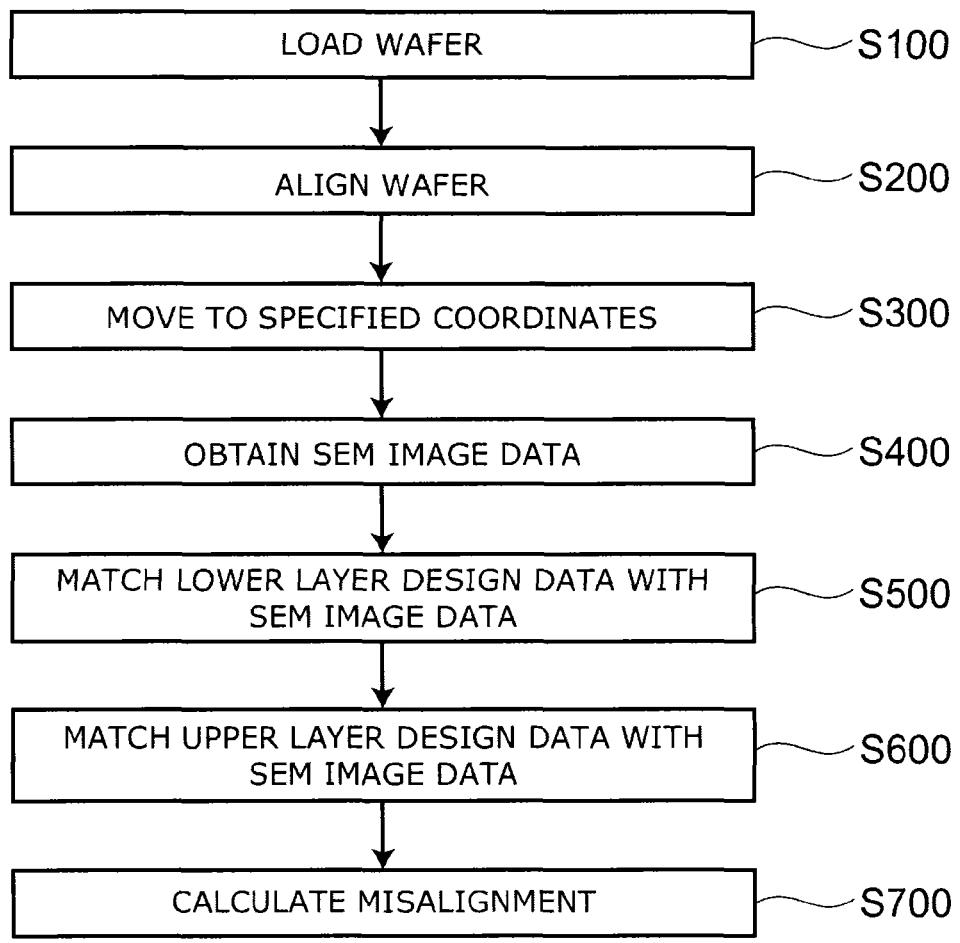
FIG. 1 is a flow chart of a process for measuring pattern alignment using a method for measuring pattern misalignment according to a first embodiment.

In general, according to one embodiment, a method for measuring pattern misalignment, includes: a first step obtaining image data of a surface image of a to-be-measured substrate including on its surface a first layer having a first pattern and a second layer provided on the first layer and having a second pattern from the surface side of the substrate, the surface image including an image of the first pattern and an image of the second pattern, and the image data being represented by an X-Y coordinate system; a second step specifying a measurement region in the image data and to specify a first reference region corresponding to the measurement region in design data of the first pattern represented by the X-Y coordinate system; a third step calculating a first shift amount ($x1$, $y1$) of the first reference region in the X-Y coordinate system using a pattern matching technique when a portion of the design data of the first pattern in the first reference region is best matched with a portion of the image data corresponding to the image of the first pattern in the measurement region; a fourth step determining, after calculating the first shift amount, a first distribution of spacing between a first contour and a first design contour and to calculate a first standard deviation of the first distribution, the first contour defining the portion of the image data corresponding to the image of the first pattern in the measurement region, and the first design contour defining the portion of the design data of the first pattern in the first reference region; a fifth step executing a plurality of times the second step, the third step, and the fourth step while expanding the measurement region of the second step, and then when it is determined that the first standard deviation for last execution is stabilized, to take the first shift amount ($x1$, $y1$) for the last execution as a first pattern misalignment; a sixth step specifying a measurement region in the image data and to specify a second reference region corresponding to the measurement region in design data of the second pattern represented by the X-Y coordinate system; a seventh step calculating a second shift amount ($x2$, $y2$) of the second reference region in the X-Y coordinate system using a pattern matching technique when a portion of the design data of the second pattern in the second reference region is best matched with a portion of the image data corresponding to the image of the second pattern in the measurement region; an eighth step determining, after calculating the second shift amount, a second distribution of spacing between a second contour and a second design contour and to calculate a second standard deviation of the second distribution, the second contour defining the portion of the image data corresponding to the image of the second pattern in the measurement region, and the second design contour defining the portion of the design data of the second pattern in the second reference region; a ninth step executing a plurality of times the sixth step, the seventh step, and the eighth step while expanding the measurement region of the sixth step, and then when it is determined that a value of the second standard deviation for last execution is stabilized, to take the second shift amount for the last execution as a second pattern misalignment (x2, y2); and a tenth step calculating a difference (x2−x1, y2−y1) between the second pattern misalignment and the first pattern misalignment as a misalignment of the second pattern with respect to the first pattern.

Embodiments will now be described with reference to the drawings. The figures used in describing the embodiments are schematic for ease of description. The shape, dimension, size relation and the like of components in the figures are not necessarily identical to those in practical application, and can be appropriately modified as long as the effects of the embodiments are achieved.

(First Embodiment)

With reference to FIGS. 1 to 11, a method for measuring pattern misalignment according to a first embodiment is described.

FIG. 1 is a flow chart of a process for measuring pattern alignment using the method for measuring pattern misalignment according to the first embodiment.

Figure 2:
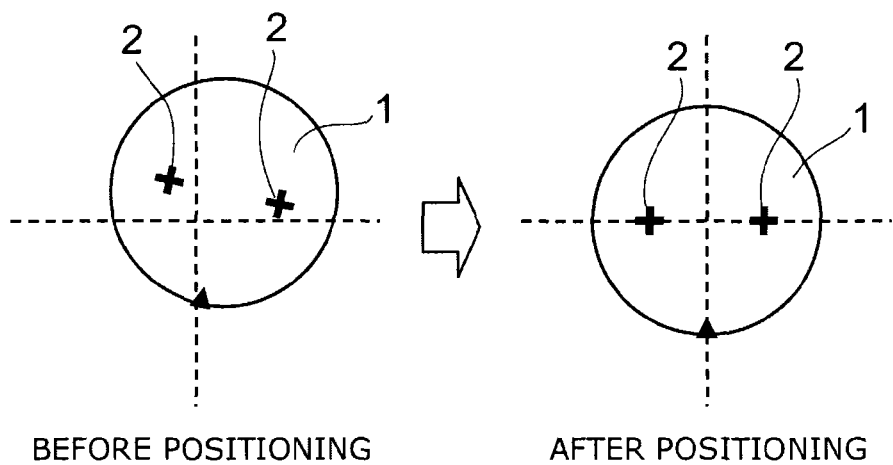
FIG. 2 is a view showing one step in the process for the measuring pattern alignment using the method for measuring the pattern misalignment according to the first embodiment.
Figure 3:
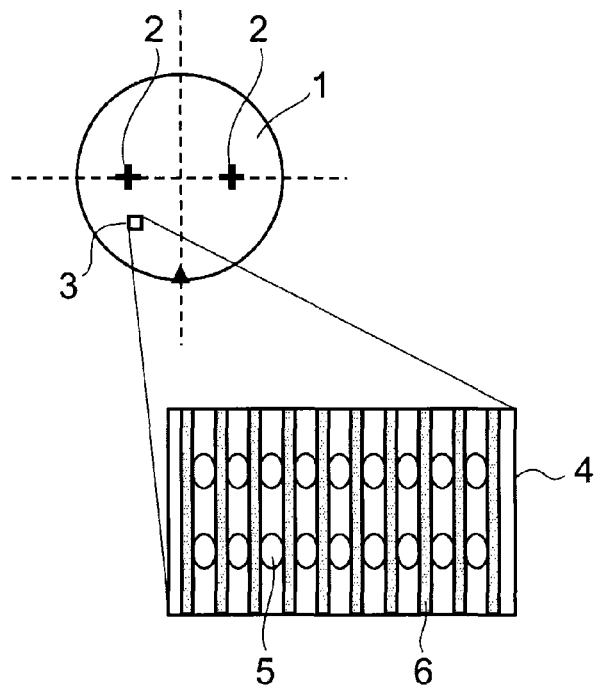
FIG. 3 is a view showing one step in the process for the measuring the pattern alignment using the method for measuring the pattern misalignment according to the first embodiment.

FIGS. 2 and 3 show one step in the process for measuring pattern alignment using the method for measuring pattern misalignment according to the first embodiment.

Figure 4:
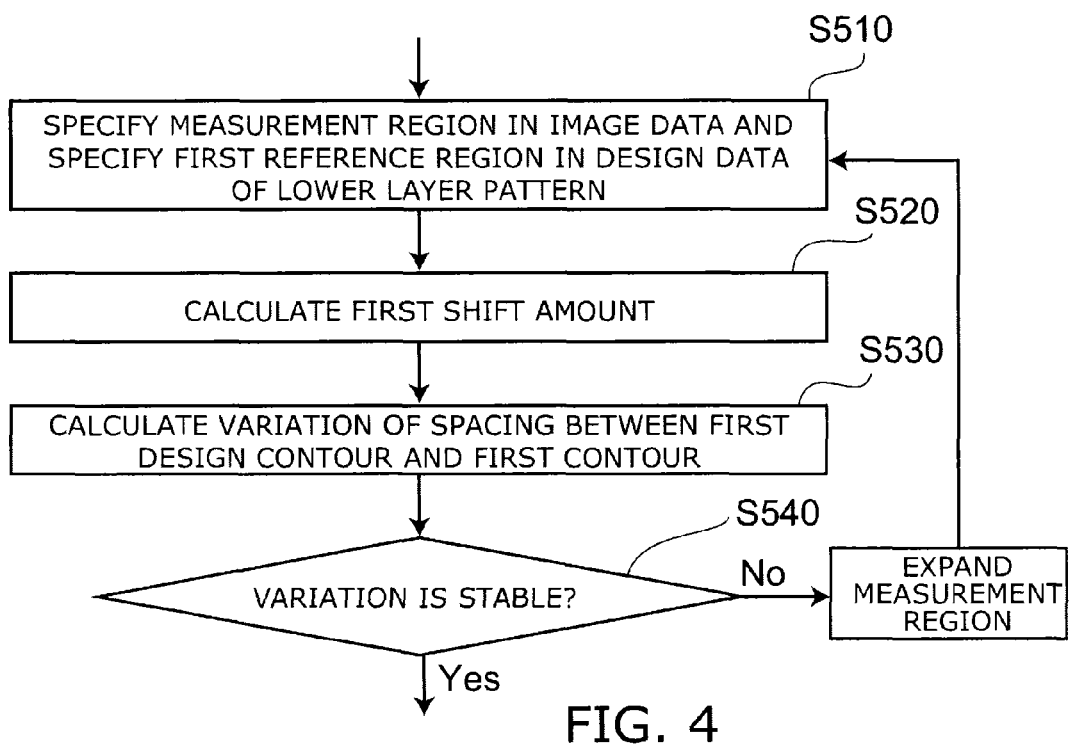
FIG. 4 is a flow chart of one step in the process for measuring the pattern alignment using the method for measuring the pattern misalignment according to the first embodiment.

FIG. 4 is a flow chart of one step in the process for measuring pattern alignment using the method for measuring pattern misalignment according to the first embodiment.

FIGS. 5 to 8 show one step in the process for measuring pattern alignment using the method for measuring pattern misalignment according to the first embodiment.

Figure 9:
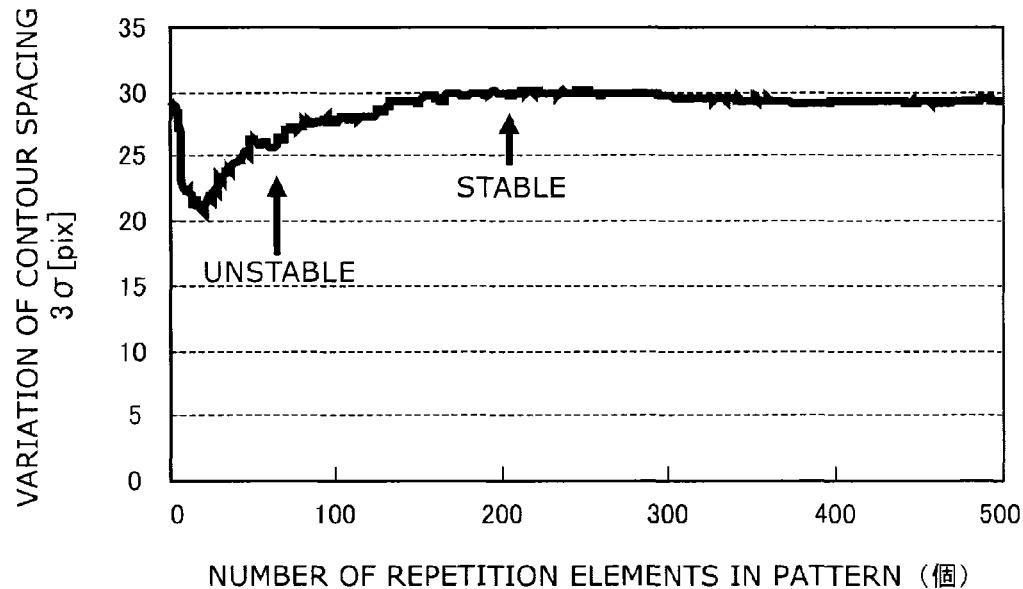
FIG. 9 is a view showing a relationship between a variation of a spacing between a design contour of design data and a contour of SEM image data on one hand and the number of repetition elements of a pattern in the measurement region on the other.

FIG. 9 shows the relationship between the variation of the spacing between the design contour of design data and the contour of SEM image data on one hand and the number of repetition elements of a pattern in the measurement region on the other.

Figure 10:
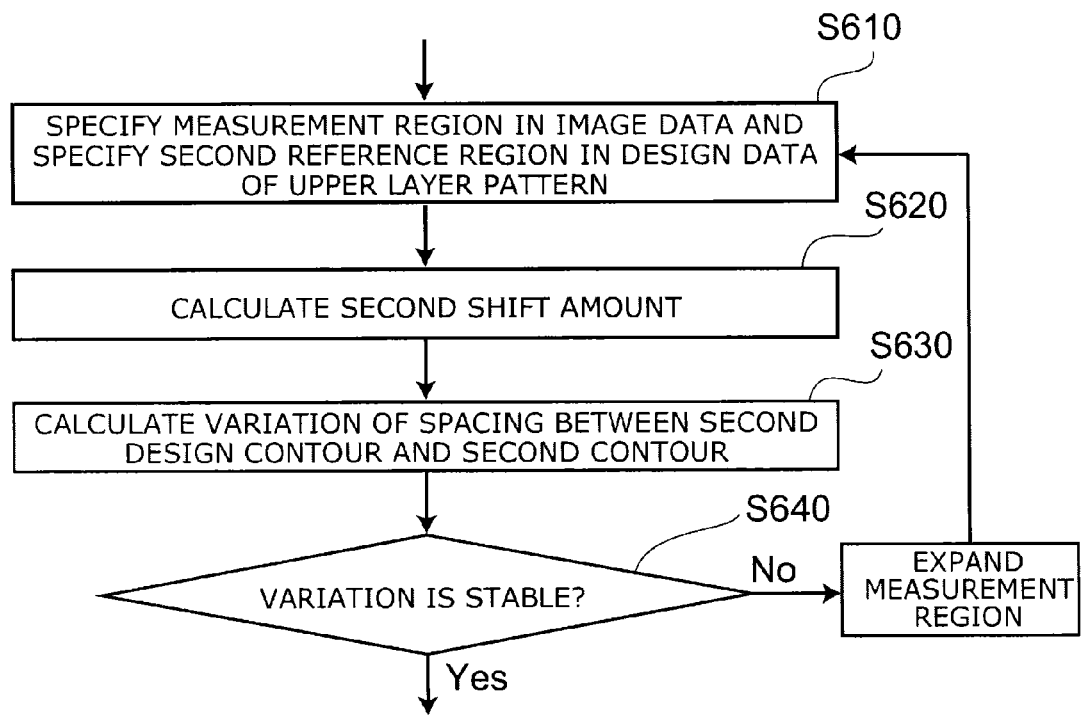
FIG. 10 is a flow chart of one step in the process for measuring the pattern alignment using the method for measuring the pattern alignment according to the first embodiment.

FIG. 10 is a flow chart of one step in the process for measuring pattern alignment using the method for measuring pattern misalignment according to the first embodiment.

Figure 11:
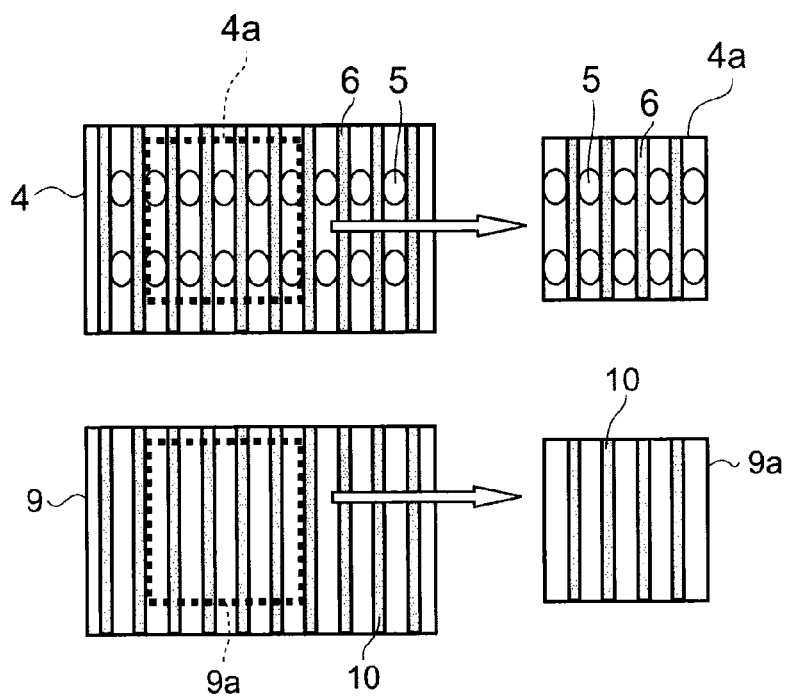
FIG. 11 is a view showing one step in the process for measuring the pattern alignment using the method for measuring the pattern misalignment according to the first embodiment.

FIG. 11 shows one step in the process for measuring pattern alignment using the method for measuring pattern misalignment according to the first embodiment.

As shown in FIG. 1, the process for measuring pattern misalignment using the method for measuring pattern misalignment according to this embodiment includes the wafer loading step (S100), the wafer alignment step (S200), the step of moving to specified coordinates (S300), the step of obtaining SEM image data (S400, first step), the step of matching lower layer design data with the SEM image data (S500), the step of matching upper layer design data with the SEM image data (S600), and the step of calculating misalignment (S700).

By the wafer loading step (S100), a to-be-measured substrate 1 is set on a measurement stage in a SEM, not shown. The to-be-measured substrate 1 includes, on its surface, a lower layer (first layer) having a lower layer pattern (first pattern), and an upper layer (second layer) formed on the lower layer and having an upper layer pattern (second pattern). For instance, in the case of forming a multilayer wiring layer, the lower layer is an insulating layer including a plurality of vias electrically connected to the wiring of the upper layer. The upper layer is an insulating layer with a plurality of grooves formed therein so that the wiring is placed above the vias. In the multilayer wiring layer, the lower layer and the upper layer described above are repeated.

Next, as shown in FIG. 2, by the wafer alignment step (S200), the to-be-measured substrate 1 is positioned so that the origin of the to-be-measured substrate 1 coincides with the origin of the SEM measurement coordinate system (X-Y coordinate system). Specifically, a registration marker 2 has been formed on the surface of the to-be-measured substrate 1. The position of the to-be-measured substrate 1 is adjusted using an optical microscope and the like so that this registration marker 2 is located at a prescribed position of the measurement coordinate system.

Next, as shown in FIG. 3, the stage of the to-be-measured substrate 1 is moved so that the position irradiated with the electron beam from the electron gun is located at specified measurement coordinates 3 (S300). Then, the electron beam is applied onto the surface of the to-be-measured substrate 1. Thus, SEM image data 4 represented by the X-Y coordinate system is obtained (S400). The SEM image data 4 represents a SEM image by the X-Y coordinate system. The SEM image includes an image of the finished lower layer pattern 5 formed on the lower layer by the process for manufacturing the lower layer pattern, and an image of the finished upper layer pattern 6 formed on the upper layer by the process for manufacturing the upper layer pattern.

Next, the step of matching lower layer design data with the SEM image data (S500) is performed. As shown in FIG. 4, the step of matching lower layer design data with the SEM image data (S500) includes the step of specifying a measurement region in the SEM image data and specifying a first reference region in the design data of the lower layer pattern (S510, second step), the step of calculating a first shift amount (S520, third step), the step of calculating the variation of the spacing between a first design contour and a first contour (S530, fourth step), and the step of determining whether the variation of the spacing between the first design contour and the first contour is stable (S540, fifth step).

Figure 5:
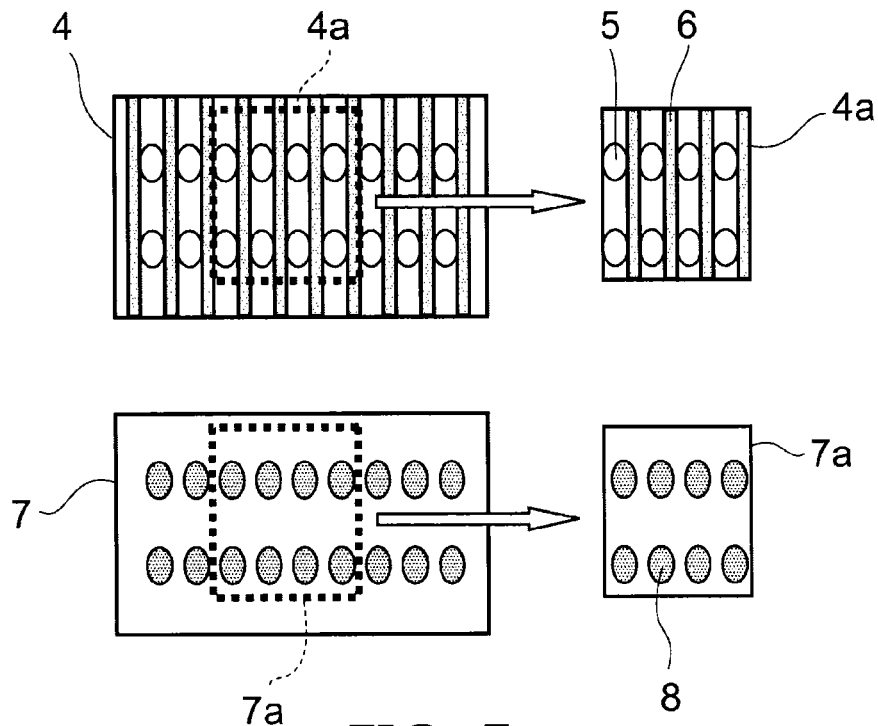
FIGS. 5 to 8 are views showing one step in the process for measuring the pattern alignment using the method for the measuring the pattern misalignment according to the first embodiment.

In the step of specifying a measurement region in the SEM image data and specifying a first reference region in the design data of the lower layer pattern (S510), as shown by the dashed line in FIG. 5, a measurement region 4a is specified in the SEM image data 4. A first reference region 7a is provided in the lower layer pattern design data 7. The first reference region 7a is a quadrangular region corresponding to the measurement region 4a in the SEM image data 4. The lower layer pattern design data 7 includes data of the contour of the design lower layer pattern 8 represented by the X-Y coordinate system (hereinafter referred to as first design contour). The contour of the finished lower layer pattern 5 in the SEM image data 4 (hereinafter referred to as first contour) has been formed by a lithography process based on the first design contour of the design lower layer pattern 8 described above.

Figure 6:
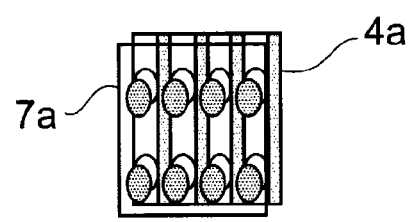

In the step of calculating a first shift amount (S520), as shown in FIG. 6, the first reference region 7a of the lower layer pattern design data 7 is superposed on the measurement region 4a of the SEM image data 4. By a pattern matching technique such as the template matching technique, the first reference region 7a is shifted on the measurement region 4a in the X-Y coordinate system so that the design lower layer pattern 8 in the first reference region 7a of the lower layer pattern design data 7 is best matched with the finished lower layer pattern 5 in the measurement region 4a of the SEM image data 4. The shift amount at this time is calculated as a first shift amount (x1, y1). The pattern matching technique can be a technique other than the template matching technique.

Next, the step of calculating the variation of the spacing between the first design contour and the first contour (S530) is performed. This step calculates the variation of the spacing between the first design contour of the design lower layer pattern 8 and the first contour of the finished lower layer pattern 5 when the design lower layer pattern 8 of the first reference region 7a described above is best matched with the finished lower layer pattern 5 of the measurement region 4a.

Figure 7:
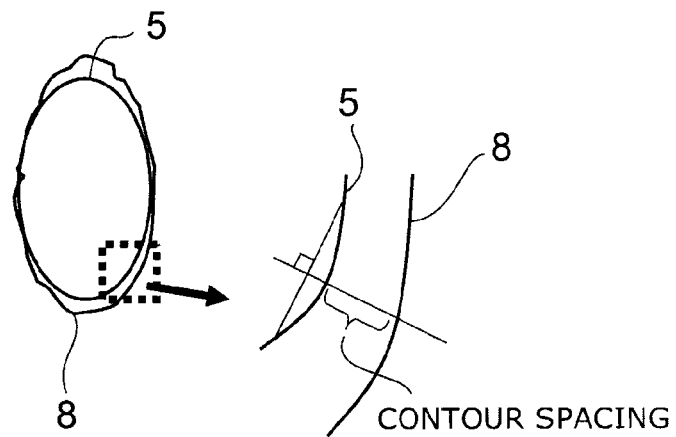

Specifically, as shown in FIG. 7, attention is focused on one of the repetition elements of the design lower layer pattern 8 and one of the repetition elements of the finished lower layer pattern 5 superposed thereon. A normal is drawn from a prescribed point of the first design contour of the aforementioned repetition element of the design lower layer pattern 8 to the first contour of the aforementioned repetition element of the finished lower layer pattern 5. The length of this normal is taken as the spacing between the first design contour of the design lower layer pattern 8 and the first contour of the finished lower layer pattern 5. At each of a plurality of points of the first design contour of one repetition element of the design lower layer pattern 8, the length of the normal described above is calculated. This calculation of the length of the normal is performed on each repetition element of the design lower layer pattern 8 in the first reference region 7a. Thus, for the number of repetition elements of the design lower layer pattern 8 occupying the first reference region 7a, a first distribution of the spacing between the first design contour of the design lower layer pattern 8 and the first contour of the finished lower layer pattern 5 is obtained. The standard deviation σ of this first distribution is calculated and taken as the variation of the spacing between the first design contour and the first contour.

Figure 8:
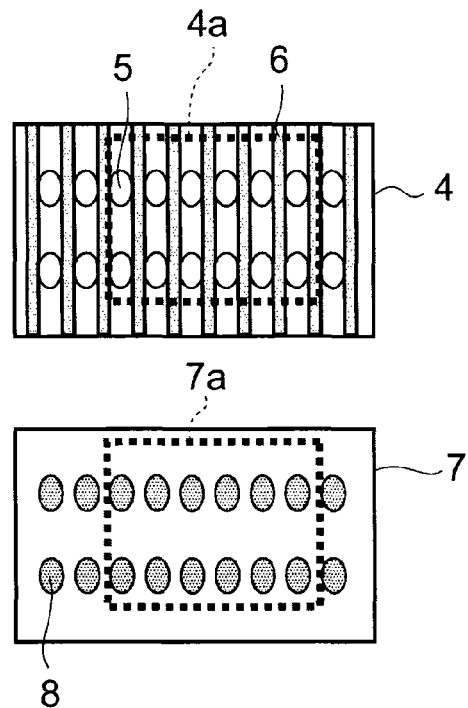

In the step of determining whether the variation of the spacing between the first design contour and the first contour is stable (S540), as shown in FIG. 8, the measurement region 4a and the first reference region 7a corresponding thereto are expanded. In conjunction therewith, the step of specifying a measurement region in the SEM image data and specifying a first reference region in the design data of the lower layer pattern (S510), the step of calculating a first shift amount (S520), and the step of calculating the variation of the spacing between a first design contour and a first contour (S530) are performed a plurality of times. Here, the expansion of the measurement region 4a and the expansion of the first reference region 7a refer to increasing the number of repetition elements of the design lower layer pattern 8 in the first reference region 7a.

FIG. 9 shows a result of calculating the variation of the spacing between the first design contour and the first contour while expanding the measurement region 4a (simply denoted as variation of contour spacing in FIG. 9). The variation of contour spacing is represented by 3σ. The size of the measurement region 4a is represented by the number of repetition elements of the design lower layer pattern 8 included in the measurement region 4a or the first reference region 7a. The contour spacing is represented by the number of pixels of the image processing apparatus, with the actual numerical value omitted.

With the expansion of the measurement region 4a and the first reference region 7a, the variation of contour spacing significantly decreases and then starts to increase. When the number of repetition elements is 200 or more, the variation of contour spacing is stabilized. In the region where the variation of contour spacing is unstable, the shift amount of the first reference region 7a calculated by the pattern matching technique has low reliability in measurement accuracy. Thus, when the variation of contour spacing is stable, the first shift amount (x1, y1) is calculated by the pattern matching technique and taken as a first pattern misalignment (x1, y1).

The determination of whether the variation of contour spacing is stable is performed e.g. as follows. The above process is executed a plurality of times. The value of the first standard deviation of the spacing between the first design contour and the first contour for the execution of the last time is calculated. The average value of the first standard deviations for the executions of a plurality of most recent times is calculated. When the difference between these values becomes a prescribed value or less, it is determined that the first standard deviation is stabilized. In the case of FIG. 9, the first standard deviation for the number of repetition elements being 200 was calculated. The average value of the first standard deviations for the number of repetition elements being 195-199 was calculated. The difference between these values was 0.1 pixels or less. Thus, it was determined that the first standard deviation was stabilized.

Next, the step of matching upper layer design data with the SEM image data (S600) is performed. As shown in FIG. 10, the step of matching upper layer design data with the SEM image data (S600) includes the step of specifying a measurement region in the SEM image data and specifying a second reference region in the design data of the upper layer pattern (S610, sixth step), the step of calculating a second shift amount (S620, seventh step), the step of calculating the variation of the spacing between a second design contour and a second contour (S630, eighth step), and the step of determining whether the variation of the spacing between the second design contour and the second contour is stable (S640, ninth step). These steps perform the same operation as the step of specifying a measurement region in the SEM image data and specifying a first reference region in the design data of the lower layer pattern (S510, second step), the step of calculating a first shift amount (S520, third step), the step of calculating the variation of the spacing between a first design contour and a first contour (S530, fourth step), and the step of determining whether the variation of the spacing between the first design contour and the first contour is stable (S540, fifth step), respectively, included in the step of matching lower layer design data with the SEM image data (S500).

In the step of specifying a measurement region in the SEM image data and specifying a second reference region in the design data of the upper layer pattern (S610), as shown by the dashed line in FIG. 11, a measurement region 4a is specified in the SEM image data 4. A second reference region 9a is provided in the upper layer pattern design data 9. The second reference region 9a is a quadrangular region corresponding to the measurement region 4a in the SEM image data 4. The upper layer pattern design data 9 includes data of the contour of the design upper layer pattern 10 represented by the X-Y coordinate system (hereinafter referred to as second design contour). The contour of the finished upper layer pattern 6 in the SEM image data 4 (hereinafter referred to as second contour) has been formed by a lithography process based on the second design contour of the design upper layer pattern 10 described above.

In the step of calculating a second shift amount (S620), the upper layer pattern design data 9a is superposed on the measurement region 4a of the SEM image data 4. By a pattern matching technique such as the template matching technique, the second reference region 9a is shifted on the measurement region 4a in the X-Y coordinate system so that the design upper layer pattern 10 in the second reference region 9a of the upper layer pattern design data 9 is best matched with the finished upper layer pattern 6 in the measurement region 4a of the SEM image data 4. The shift amount at this time is calculated as a second shift amount (x2, y2). The pattern matching technique can be a technique other than the template matching technique.

Next, the step of calculating the variation of the spacing between the second design contour and the second contour (S630) is performed. This step calculates the variation of the spacing between the second design contour of the design upper layer pattern 10 and the second contour of the finished upper layer pattern 6 when the design upper layer pattern 10 of the second reference region 9a described above is best matched with the finished upper layer pattern 6 of the measurement region 4a. The specific calculation method is the same as that of the step of calculating the variation of the spacing between the first design contour and the first contour (S530), and thus the description thereof is omitted. By this step, for the number of repetition elements of the design upper layer pattern 10 occupying the second reference region 9a, a second distribution of the spacing between the second design contour of the design upper layer pattern 10 and the second contour of the finished upper layer pattern 6 is obtained. The standard deviation σ of this second distribution is calculated and taken as the variation of the spacing between the second design contour and the second contour.

Next, the step of determining whether the variation of the spacing between the second design contour and the second contour is stable (S640) is performed. This is performed similarly to the step of determining whether the variation of the spacing between the first design contour and the first contour is stable (S540), and thus the description thereof is omitted. By this step, when the variation of the spacing between the second design contour and the second contour is stable, the second shift amount (x2, y2) is calculated by the pattern matching technique and taken as a second pattern misalignment (x2, y2).

Next, the step of calculating misalignment (S700) is performed. In this step, the difference (x2−x1, y2−y1) between the second pattern misalignment (x2, y2) calculated by the step of matching upper layer design data with the SEM image data (S600) and the first pattern misalignment (x1, y1) calculated by the step of matching lower layer design data with the SEM image data (S500) is calculated as the misalignment of the upper layer pattern (second pattern) with respect to the lower layer pattern (first pattern).

In the method for measuring pattern misalignment according to this embodiment, the main pattern of the semiconductor device is directly observed by SEM. Thus, the misalignment measurement has high spatial resolution. This facilitates correction for the misalignment of the lithography process. Furthermore, in pattern matching, pattern misalignment is measured in the state in which the variation of contour spacing of the pattern is stable. Thus, the reliability of the measurement is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for measuring pattern misalignment, comprising:
    a first step obtaining image data of a surface image of a to-be-measured substrate including on its surface a first layer having a first pattern and a second layer provided on the first layer and having a second pattern from the surface side of the substrate, the surface image including an image of the first pattern and an image of the second pattern, and the image data being represented by an X-Y coordinate system;
    a second step specifying a measurement region in the image data and to specify a first reference region corresponding to the measurement region in design data of the first pattern represented by the X-Y coordinate system;
    a third step calculating a first shift amount (x1, y1) of the first reference region in the X-Y coordinate system using a pattern matching technique when a portion of the design data of the first pattern in the first reference region is best matched with a portion of the image data corresponding to the image of the first pattern in the measurement region;
    a fourth step determining, after calculating the first shift amount, a first distribution of spacing between a first contour and a first design contour and to calculate a first standard deviation of the first distribution, the first contour defining the portion of the image data corresponding to the image of the first pattern in the measurement region, and the first design contour defining the portion of the design data of the first pattern in the first reference region;
    a fifth step executing a plurality of times the second step, the third step, and the fourth step while expanding the measurement region of the second step, and then when it is determined that the first standard deviation for last execution is stabilized, to take the first shift amount (x1, y1) for the last execution as a first pattern misalignment;
    a sixth step specifying a measurement region in the image data and to specify a second reference region corresponding to the measurement region in design data of the second pattern represented by the X-Y coordinate system;
    a seventh step calculating a second shift amount (x2, y2) of the second reference region in the X-Y coordinate system using a pattern matching technique when a portion of the design data of the second pattern in the second reference region is best matched with a portion of the image data corresponding to the image of the second pattern in the measurement region;
    an eighth step determining, after calculating the second shift amount, a second distribution of spacing between a second contour and a second design contour and to calculate a second standard deviation of the second distribution, the second contour defining the portion of the image data corresponding to the image of the second pattern in the measurement region, and the second design contour defining the portion of the design data of the second pattern in the second reference region;
    a ninth step executing a plurality of times the sixth step, the seventh step, and the eighth step while expanding the measurement region of the sixth step, and then when it is determined that a value of the second standard deviation for last execution is stabilized, to take the second shift amount for the last execution as a second pattern misalignment (x2, y2); and a tenth step calculating a difference (x2−x1, y2−y1) between the second pattern misalignment and the first pattern misalignment as a misalignment of the second pattern with respect to the first pattern.

2. The method according to claim 1, wherein the image data is a secondary electron image based on a scanning electron microscope.

3. The method according to claim 1, wherein
when a difference between a value of the first standard deviation for the last execution and an average value of the first standard deviations for the executions of a plurality of most recent times in the fifth step becomes a prescribed value or less, it is determined that the value of the first standard deviation for the last execution is stabilized, and when a difference between a value of the second standard deviation for the last execution and an average value of the second standard deviations for the executions of a plurality of most recent times in the ninth step becomes a prescribed value or less, it is determined that the value of the second standard deviation for the last execution is stabilized.

4. The method according to claim 1, wherein
the image data is a secondary electron image based on a scanning electron microscope, when a difference between a value of the first standard deviation for the last execution and an average value of the first standard deviations for the executions of a plurality of most recent times in the fifth step becomes a prescribed value or less, it is determined that the value of the first standard deviation for the last execution is stabilized, and when a difference between a value of the second standard deviation for the last execution and an average value of the second standard deviations for the executions of a plurality of most recent times in the ninth step becomes a prescribed value or less, it is determined that the value of the second standard deviation for the last execution is stabilized.

5. The method according to claim 1, wherein
when the first distribution is determined in the fourth step, the spacing between the first contour and the first design contour is length of a normal extending from one point on the first design contour to the first contour, and when the second distribution is determined in the eighth step, the spacing between the second contour and the second design contour is length of a normal extending from one point on the second design contour to the second contour.

6. The method according to claim 1, wherein
the image data is a secondary electron image based on a scanning electron microscope, when the first distribution is determined in the fourth step, the spacing between the first contour and the first design contour is length of a normal extending from one point on the first design contour to the first contour, and when the second distribution is determined in the eighth step, the spacing between the second contour and the second design contour is length of a normal extending from one point on the second design contour to the second contour.

7. The method according to claim 1, wherein
when a difference between a value of the first standard deviation for the last execution and an average value of the first standard deviations for the executions of a plurality of most recent times in the fifth step becomes a prescribed value or less, it is determined that the value of the first standard deviation for the last execution is stabilized, when a difference between a value of the second standard deviation for the last execution and an average value of the second standard deviations for the executions of a plurality of most recent times in the ninth step becomes a prescribed value or less, it is determined that the value of the second standard deviation for the last execution is stabilized, when the first distribution is determined in the fourth step, the spacing between the first contour and the first design contour is length of a normal extending from one point on the first design contour to the first contour, and when the second distribution is determined in the eighth step, the spacing between the second contour and the second design contour is length of a normal extending from one point on the second design contour to the second contour.

8. The method according to claim 1, wherein the pattern matching technique in the third step and the seventh step is a template matching technique.

9. The method according to claim 1, wherein
the image data is a secondary electron image based on a scanning electron microscope, and the pattern matching technique in the third step and the seventh step is a template matching technique.

10. The method according to claim 1, wherein
when a difference between a value of the first standard deviation for the last execution and an average value of the first standard deviations for the executions of a plurality of most recent times in the fifth step becomes a prescribed value or less, it is determined that the value of the first standard deviation for the last execution is stabilized, when a difference between a value of the second standard deviation for the last execution and an average value of the second standard deviations for the executions of a plurality of most recent times in the ninth step becomes a prescribed value or less, it is determined that the value of the second standard deviation for the last execution is stabilized, and the pattern matching technique in the third step and the seventh step is a template matching technique.

11. The method according to claim 1, wherein
when the first distribution is determined in the fourth step, the spacing between the first contour and the first design contour is length of a normal extending from one point on the first design contour to the first contour, when the second distribution is determined in the eighth step, the spacing between the second contour and the second design contour is length of a normal extending from one point on the second design contour to the second contour, and the pattern matching technique in the third step and the seventh step is a template matching technique.

12. The method according to claim 1, wherein
the first pattern is composed of first repetition elements, and when the first distribution is determined in the fourth step, the spacing between the first contour and the first design contour is obtained at a plurality of prescribed positions in each of the first repetition elements, and the second pattern is composed of second repetition elements, and when the second distribution is determined in the eighth step, the spacing between the second contour and the second design contour is obtained at a plurality of prescribed positions in each of the second repetition elements.

13. The method according to claim 1, wherein
the image data is a secondary electron image based on a scanning electron microscope,
the first pattern is composed of first repetition elements, and when the first distribution is determined in the fourth step, the spacing between the first contour and the first design contour is obtained at a plurality of prescribed positions in each of the first repetition elements, and
the second pattern is composed of second repetition elements, and when the second distribution is determined in the eighth step, the spacing between the second contour and the second design contour is obtained at a plurality of prescribed positions in each of the second repetition elements.

14. The method according to claim 1, wherein
when a difference between a value of the first standard deviation for the last execution and an average value of the first standard deviations for the executions of a plurality of most recent times in the fifth step becomes a prescribed value or less, it is determined that the value of the first standard deviation for the last execution is stabilized,
when a difference between a value of the second standard deviation for the last execution and an average value of the second standard deviations for the executions of a plurality of most recent times in the ninth step becomes a prescribed value or less, it is determined that the value of the second standard deviation for the last execution is stabilized,
the first pattern is composed of first repetition elements, and when the first distribution is determined in the fourth step, the spacing between the first contour and the first design contour is obtained at a plurality of prescribed positions in each of the first repetition elements, and
the second pattern is composed of second repetition elements, and when the second distribution is determined in the eighth step, the spacing between the second contour and the second design contour is obtained at a plurality of prescribed positions in each of the second repetition elements.

15. The method according to claim 1, wherein
when the first distribution is determined in the fourth step, the spacing between the first contour and the first design contour is length of a normal extending from one point on the first design contour to the first contour,
when the second distribution is determined in the eighth step, the spacing between the second contour and the second design contour is length of a normal extending from one point on the second design contour to the second contour,
the first pattern is composed of first repetition elements, and when the first distribution is determined in the fourth step, the spacing between the first contour and the first design contour is obtained at a plurality of prescribed positions in each of the first repetition elements, and
the second pattern is composed of second repetition elements, and when the second distribution is determined in the eighth step, the spacing between the second contour and the second design contour is obtained at a plurality of prescribed positions in each of the second repetition elements.

16. The method according to claim 1, wherein
the pattern matching technique in the third step and the seventh step is a template matching technique,
the first pattern is composed of first repetition elements, and when the first distribution is determined in the fourth step, the spacing between the first contour and the first design contour is obtained at a plurality of prescribed positions in each of the first repetition elements, and
the second pattern is composed of second repetition elements, and when the second distribution is determined in the eighth step, the spacing between the second contour and the second design contour is obtained at a plurality of prescribed positions in each of the second repetition elements.

* * * * *